United States Patent
Wada et al.

(10) Patent No.: US 7,944,242 B2
(45) Date of Patent: May 17, 2011

(54) SEMICONDUCTOR INTEGRATED CIRCUIT HAVING INSULATED GATE FIELD EFFECT TRANSISTORS

(75) Inventors: Masaharu Wada, Kanagawa-ken (JP); Takehiko Hojo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/703,924

(22) Filed: Feb. 11, 2010

(65) Prior Publication Data
US 2010/0321065 A1 Dec. 23, 2010

(30) Foreign Application Priority Data
Jun. 18, 2009 (JP) ................. P2009-145854

(51) Int. Cl.
*H03K 19/096* (2006.01)
*H03K 3/356* (2006.01)
(52) U.S. Cl. .......................... 326/95; 327/208
(58) Field of Classification Search .............. 326/93, 326/95, 98; 327/208–212, 214, 215
See application file for complete search history.

(56) References Cited

U.S. PATENT DOCUMENTS

| | | | |
|---|---|---|---|
| 6,362,680 B1 * | 3/2002 | Barnes | 327/407 |
| 6,731,142 B1 * | 5/2004 | Wang et al. | 327/115 |
| 7,456,674 B2 * | 11/2008 | Oakland | 327/291 |
| 7,583,124 B2 * | 9/2009 | Kuo et al. | 327/276 |
| 7,664,219 B2 * | 2/2010 | Tso et al. | 377/73 |
| 2002/0131487 A1 * | 9/2002 | Butler et al. | 375/229 |
| 2007/0236249 A1 * | 10/2007 | Wong | 326/37 |
| 2008/0043898 A1 * | 2/2008 | Kim | 377/75 |
| 2009/0040809 A1 | 2/2009 | Wada et al. | |

FOREIGN PATENT DOCUMENTS

JP 2006-252696 9/2006

* cited by examiner

*Primary Examiner* — Vibol Tan
*Assistant Examiner* — Dylan White
(74) *Attorney, Agent, or Firm* — Turocy & Watson, LLP

(57) ABSTRACT

A semiconductor integrated circuit includes a multiplexer, a signal generating circuit, a control circuit, m inverters, n two-input NOR circuits, and cascade connected n two-shift registers. The control circuit generates a control signal in the disable state in a normal operation in which the clock signal is supplied. The control circuit generates a control signal in an enable state in the other-than-normal operation in which a higher voltage source voltage is supplied while the clock signal is not supplied. The multiplexer receives the clock signal and a low-frequency signal outputted from the signal generating circuit. The multiplexer supplies the clock signal to the sequence of the inverters upon receipt of the control signal in the disable state, and supplies the low-frequency signal to the sequence of the inverters upon receipt of the control signal in the enable state.

12 Claims, 12 Drawing Sheets

| Sct(Enable) | Scnt |
|---|---|
| 1'st | "1" |
| 2'nd | "0" |
| 3'rd | "1" |
| 4-th | "0" |

FIG. 7

SEMICONDUCTOR INTEGRATED CIRCUIT HAVING INSULATED GATE FIELD EFFECT TRANSISTORS

CROSS REFERENCE TO RELATED APPLICATION

This application is based upon and claims the benefit of priority from the prior Japanese Patent Application No. P2009-145854, filed on Jun. 18, 2009, the entire contents of which are incorporated herein by reference.

FIELD OF THE INVENTION

The invention relates to a semiconductor integrated circuit having insulated gate field effect transistors.

DESCRIPTION OF THE BACKGROUND

Highly-functional, multifunctional, and power saving electric devices have been developed for industrial use, for consumer use, and the like. With the development, CMOS circuits which operate at high speed with low power consumption are widely used in various fields. A CMOS circuit is composed of a P-channel insulated gate field effect transistor and an N-channel insulated gate field effect transistor. Transistor characteristics in an insulated gate field effect transistor including an MOS transistor or an MIS transistor are degraded due to bias temperature instability ("BTI"). In recent years, it has been revealed that the progress in miniaturization of insulated gate field effect transistors makes a Vth (threshold voltage) shift of the insulated gate field effect transistor due to the BTI larger than the conventional Vth shift. Especially, a Vth shift of a P-channel insulated gate field effect transistor due to negative bias temperature instability ("NBTI") is more remarkable than a Vth shift of an N-channel insulated gate field effect transistor due to positive bias temperature instability ("PBTI"). Japanese Patent Application Publication No. 2006-252696 discloses a way to address the Vth shift.

A semiconductor integrated circuit having an insulated gate field effect transistor has a following problem. Specifically, if a certain voltage is applied to the logic gate, for example, for a long period, a P-channel insulated gate field effect transistor that constitutes a logic gate makes a larger Vth shift due to the NBTI at the time of a burn-in operation or at the stand-by than at the time of a normal operation. The increase in the Vth shift due to the NBTI causes degradation of operation margins of the logic gate and operation failure of the logic gate. Consequently, the Vth shift due to the NBTI leads to problems such as characteristic degradation and operation failure in a semiconductor integrated circuit including a logic gate or the like.

SUMMARY OF THE INVENTION

According to an aspect of the invention is provided a semiconductor integrated circuit, comprising a control circuit to output a control signal in a disable state when an input signal is supplied, and to output a control signal in an enable state when the input signal is not supplied, a signal generating circuit to generate a low-frequency signal based on the control signal, the low-frequency signal having a frequency lower than the input signal has, a multiplexer to receive the input signal and the low-frequency signal, to output the input signal upon receipt of the control signal in the disable state, and to output the low-frequency signal upon receipt of the control signal in the enable state, a first logic gate to receive the signal outputted from the multiplexer, the first logic gate having any one of a single stage configuration and a multi-stage configuration, and a second logic gate to receive the control signal and a signal outputted from the first logic gate, to output the signal outputted from the first logic gate upon receipt of the control signal in the disable state, and to stop outputting the signal outputted from the first logic gate upon receipt of the control signal in the enable state.

According to another aspect of the invention is provided a semiconductor integrated circuit, comprising a control circuit to output a control signal in a disable state when an input signal is supplied, and to output a control signal in an enable state when the input signal is not supplied, a counter to alternately generate a count signal having a value of 1 and a count signal having a value of 0 (zero) based on the control signal every time the input signal is updated, a multiplexer to receive the input signal and the count signal, to output the input signal upon receipt of the control signal in the disable state, and to output the count signal upon receipt of the control signal in the enable state, a first logic gate to receive the signal outputted from the multiplexer, the first logic gate having any one of a single stage configuration and a multi-stage configuration, and a second logic gate to receive the control signal and a signal outputted from the first logic gate, to output the signal outputted from the first logic gate upon receipt of the control signal in the disable state, and to stop outputting the signal outputted from the first logic gate upon receipt of the control signal in the enable state.

According to further another aspect of the invention is provided a semiconductor integrated circuit, comprising a control circuit to output a control signal in a disable state when an input signal is supplied, and to output a control signal in an enable state when the input signal is not supplied, a first logic gate to receive the input signal, the first logic gate having any one of a single stage configuration and a multi-stage configuration, a power supply circuit to supply the first logic gate with a higher voltage source voltage upon receipt of the control signal in the disable state, and to stop supplying the first logic gate with the higher voltage source voltage upon receipt of the control signal in the enable state, and a second logic gate to receive the control signal and a signal outputted from the first logic gate, to output the signal outputted from the first logic gate upon receipt of the control signal in the disable state, and to stop outputting the signal outputted from the first logic gate upon receipt of the control signal in the enable state.

BRIEF DESCRIPTION OF THE DRAWINGS

FIG. 7 is a table explaining operations of a counter according to the second embodiment the invention.

DETAILED DESCRIPTION OF THE INVENTION

Embodiments of the invention will be described with reference to the drawings.

Figure 1:
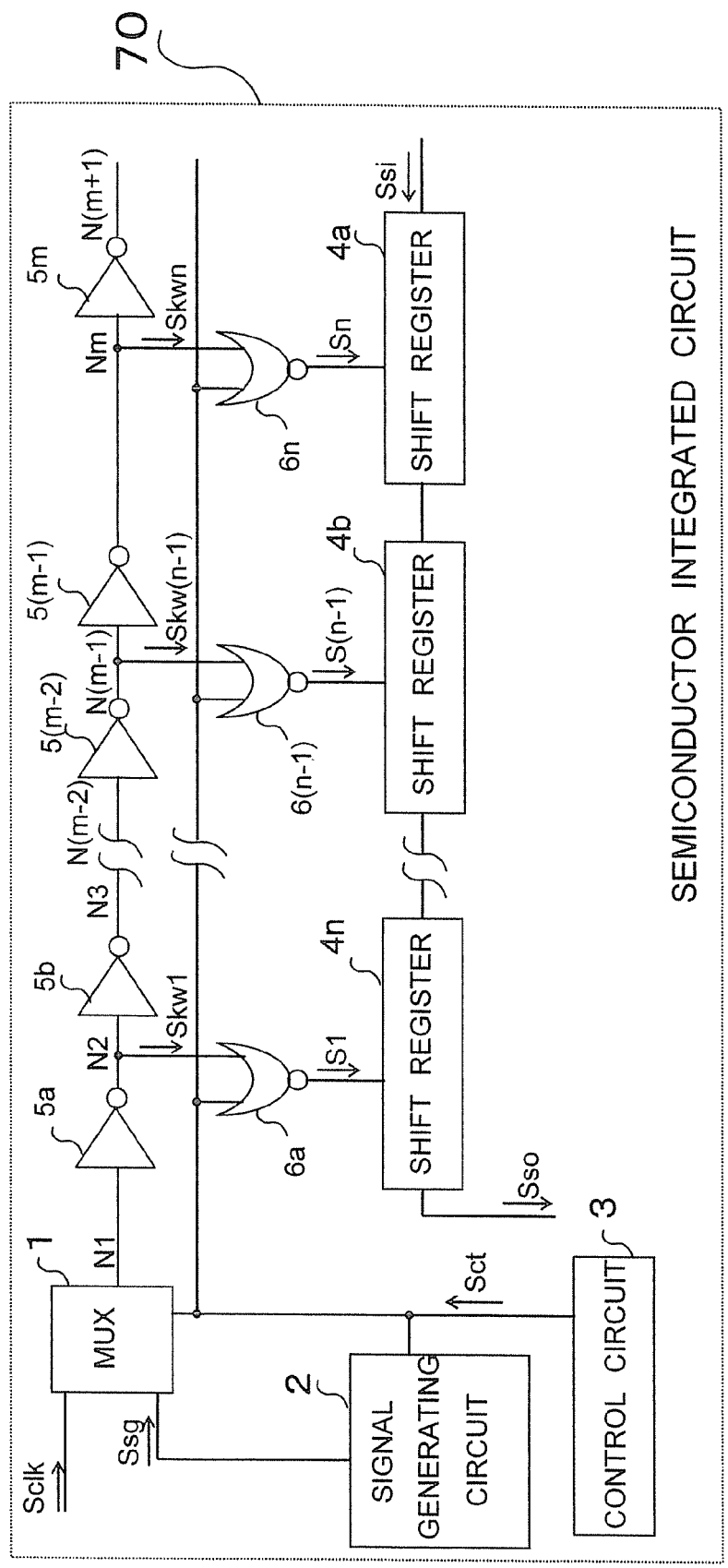
FIG. 1 is a circuit diagram showing a semiconductor integrated circuit according to a first embodiment of the invention.
Figure 2:
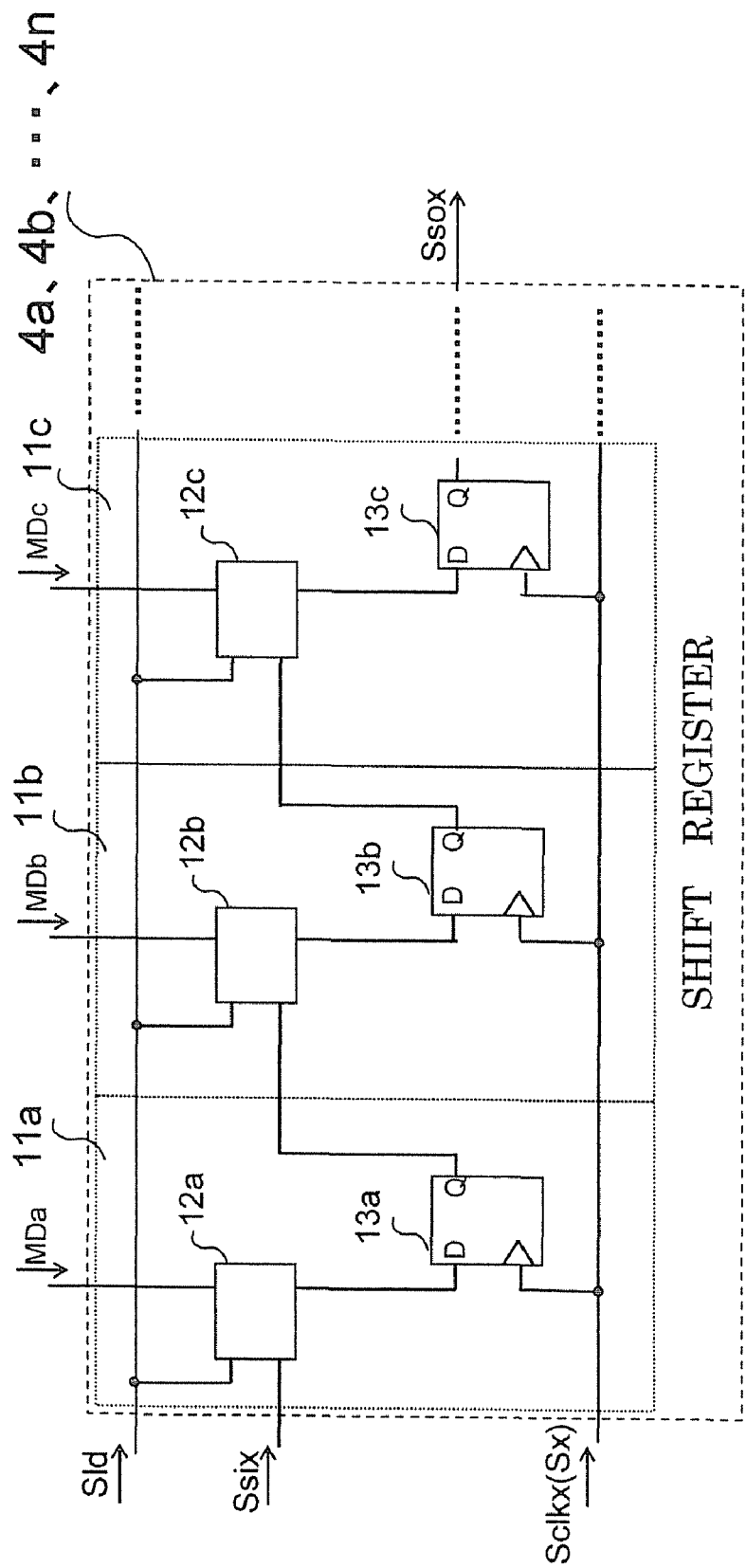
FIG. 2 is a circuit diagram showing a shift register according to the first embodiment of the invention.
Figure 3:
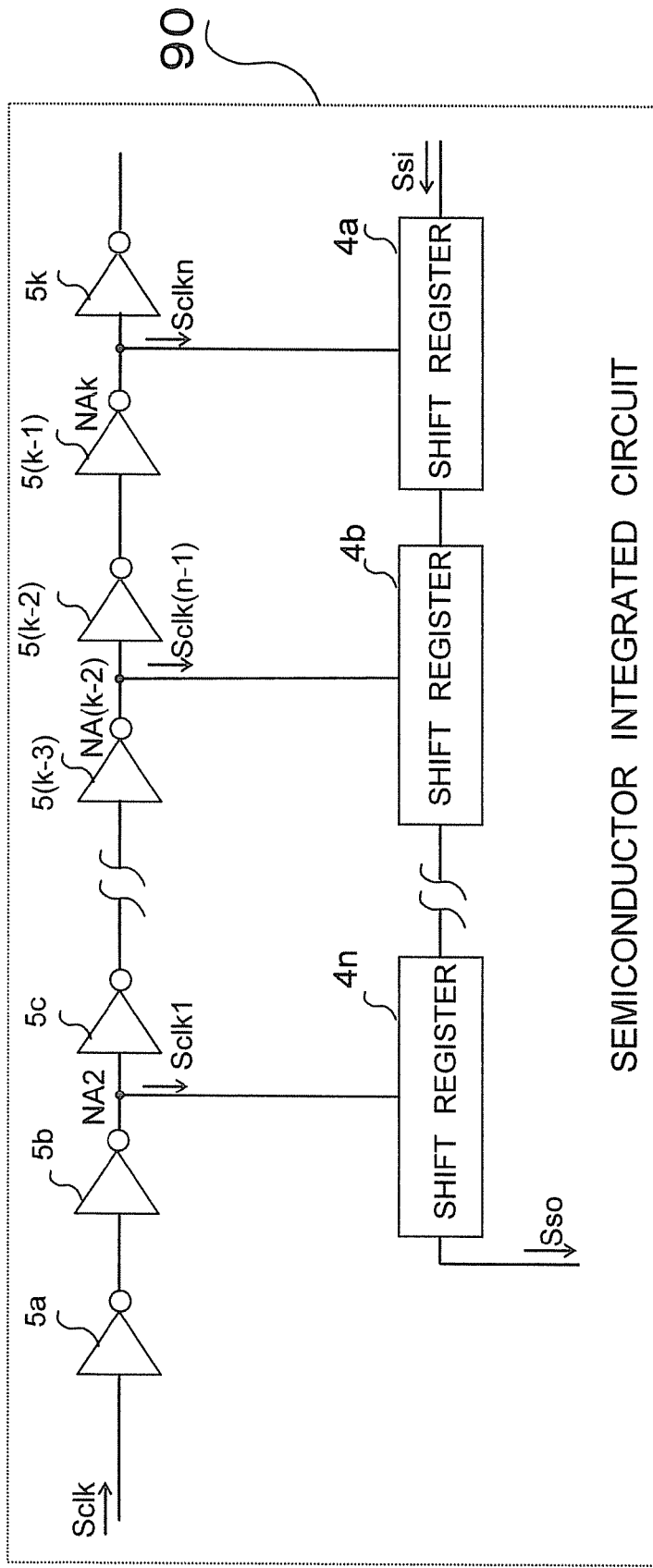
FIG. 3 is a circuit diagram showing a semiconductor integrated circuit of a comparative example according to the first embodiment the invention.

A semiconductor integrated circuit according to a first embodiment of the invention will be described with reference to the drawings. FIG. 1 is a circuit diagram showing a semiconductor integrated circuit. FIG. 2 is a circuit diagram showing a shift register. FIG. 3 is a circuit diagram showing a semiconductor integrated circuit of a comparative example. In the embodiment, when a clock signal is not supplied to an inverter, a low-frequency signal with a frequency lower than that of the clock signal is inputted to the inverter.

As shown in FIG. 1, a semiconductor integrated circuit is provided with a multiplexer ("MUX") 1, a signal generating circuit 2, a control circuit 3, an inverter 5a, an inverter 5b, an inverter 5(m−2), an inverter 5(m−1), an inverter 5m, a two-input NOR circuit 6a, a two-input NOR circuit 6(n−1), a two-input NOR circuit 6n, a shift register 4a, a shift register 4b, and a shift register 4n.

The semiconductor integrated circuit 70 includes m inverters, n two-input NOR circuits, and n shift registers. The semiconductor integrated circuit 70 is a semiconductor memory device having a memory and a serial input/output shift register, for example.

The control circuit 3 generates a control signal Sct in a disable state (a value of "0" (zero), for example) when a clock signal Sclk as an input signal is supplied to the inside of the semiconductor integrated circuit 70. The control circuit 3 generates a control signal Sct in an enable state (a value of "1", for example) when the clock signal Sclk is not supplied to the inside of the semiconductor integrated circuit 70.

Here, a clock signal Sclk is supplied to the semiconductor integrated circuit 70 in a normal operation. The time when the clock signal Sclk is not being supplied to the inside of the semiconductor integrated circuit 70 indicates states, such as when the semiconductor integrated circuit 70 is at the stand-by, such as in a sleep mode or setup, or in a burn-in operation. The clock signal Sclk is inputted to each of the shift registers 4 via the multiplexer 1, each of the inverters 5, and each of the two-input NOR circuits 6 when a control signal Sct is in a disable state. For example, the clock signal Sclk is inputted to the shift register 4n via the multiplexer 1, the inverter 5a, and the two-input NOR circuit 6a. The clock signal Sclk is not inputted to each of the shift registers 4 when a control signal Sct is in an enable state (details will be described later).

The signal generating circuit 2 receives the control signal Sct and generates a low-frequency signal Ssg, which is a signal with a frequency lower than that of the clock signal Sclk, based on the control signal Sct. For example, the low-frequency signal Ssg is a clock signal with a frequency lower than one-tenth of the clock signal Sclk.

The multiplexer (MUX) 1, which is also called a data selector, receives a clock signal Sclk, a low-frequency signal Ssg, and a control signal Sct. When the control signal Sct is in a disable state (a value of "0" (zero), for example), the multiplexer 1 selects and outputs the clock signal Sclk from a node N1. When the control signal Sct is in an enable state (a value of "1", for example), the multiplexer 1 selects and outputs the low-frequency signal Ssg from the node N1.

The inverter 5a is provided between the multiplexer 1 and the inverter 5b and between the multiplexer 1 and the two-input NOR circuit 6a (between the node N1 and a node N2). The inverter 5a receives a signal of the node N1 outputted from the multiplexer 1, and outputs a signal Skw1 from the node N2, the signal Skw1 obtained by reversing the signal of the node N1.

The inverter 5b is provided between the node N2 and a node N3, receives a signal of the node N2 outputted from inverter 5a, and outputs an unshown signal Skw2 from the node N3, the signal Skw2 obtained by reversing the signal of the node N2.

The inverter 5(m−2) is provided between a node N(m−2) and a node N(m−1), receives a signal of the node N(m−2) outputted from an unshown inverter 5(m−3), and outputs a signal Skw(n−1) from the node N(m−1), the signal Skw(n−1) obtained by reversing the signal of the node N(m−2).

The inverter 5(m−1) is provided between the node N(m−1) and a node Nm, and receives a signal of the node N(m−1) outputted from the inverter 5(m−2). The inverter 5(m−1) outputs a signal Skwn from the node Nm, the signal Skwn obtained by reversing the signal of the node N(m−1).

The inverter 5m is provided between the node Nm and a node N(m+1), and receives a signal of the node Nm outputted from the inverter 5(m−1). The inverter 5m outputs an unshown signal Skw(n+1) from the node N(m+1), the signal Skw(n+1) obtained by reversing the signal of the node Nm.

In FIG. 1, one stage of the inverter 5 is provided between each adjacent nodes (the inverter 5a is provided between the node N1 and the node N2, for example). Alternatively, odd-numbered stages (three or more stages) of inverters may be provided.

The two-input NOR circuit 6a receives a control signal Sct and a signal Skw1, and outputs a signal S1 that is a logically operated signal, to the shift register 4n. Specifically, when the control signal Sct is in a disable state (a value of "0" (zero), for example) and the semiconductor integrated circuit 70 is in a normal operation, the signal S1 becomes a clock signal in-phase with the clock signal Sclk. When the control signal Sct is in an enable state (a value of "1", for example) and the semiconductor integrated circuit 70 is in the operations other than the normal operation, the signal S1 maintains a Low level (a value of 0 (zero)) and the clock signal Sclk is not inputted to the shift register 4n.

The two-input NOR circuit 6(n−1) receives the control signal Sct and the signal Skw(n−1), and outputs a signal S(n−1) that is a logically operated signal, to the shift register 4b. Specifically, when the control signal Sct is in a disable state (a value of "0" (zero), for example) and the semiconductor integrated circuit 70 is in a normal operation, the signal S(n−1) becomes a clock signal in-phase with the clock signal Sclk. When the control signal Sct is in an enable state (a value of "1", for example) and the semiconductor integrated circuit 70 is in the operations other than the normal operation, the signal S(n−1) maintains a Low level (a value of 0 (zero)) and the clock signal Sclk is not inputted to the shift register 4b.

The two-input NOR circuit 6n receives the control signal Sct and the signal Skwn, and outputs a signal Sn that is a logically operated signal, to the shift register 4a. Specifically, when the control signal Sct is in a disable state (a value of "0" (zero), for example) and the semiconductor integrated circuit 70 is in a normal operation, the signal Sn becomes a clock signal in-phase with the clock signal Sclk. When the control signal Sct is in an enable state (a value of "1", for example) and the semiconductor integrated circuit 70 is in the operations other than the normal operation, the signal Sn maintains a Low level (a value of 0 (zero)) and the clock signal Sclk is not inputted to the shift register 4a.

In other words, when the control signal Sct is in a disable state (a value of "0" (zero), for example), the inverter 5a, the inverter 5b, ..., the inverter 5(m−2), the inverter 5(m−1), the inverter 5m, the shift register 4n, ..., the shift register 4b, and the shift register 4a operate normally. When the control signal Sct is in an enable state (a value of "1", for example), the inverter 5a, the inverter 5b, ..., the inverter 5(m−2), the inverter 5(m−1), and the inverter 5m operate at a low frequency, while the shift register 4n, ..., the shift register 4b, and the shift register 4a do not operate because the shift register 4n, ..., the shift register 4b, and the shift register 4a do not receive the clock signal Sclk, but receive a certain value of "0" (zero).

The n shift registers (4a, 4b, ..., 4n) are cascade connected to one another. A serial input signal Ssi is inputted to the shift register 4a from the right end side in FIG. 1, and signal processing is performed in a serial manner. A serial output signal Sso is outputted from the left side of the shift register 4n in FIG. 1. The cascade connected n shift registers (4a, 4b, ..., 4n) perform the serial input/output operation.

As shown in FIG. 2, each of the shift registers (4a, 4b, ..., 4n) is provided with multiple signal processing units (signal processing units 11a, 11b, 11c, ...) that are cascade connected to one another.

The signal processing unit 11a that is a signal processing unit of a first stage, is provided with a logic circuit unit 12a and a flip-flop 13a.

The logic circuit unit 12a is provided with multiple logic gates that are composed of three two-input AND circuits, for example, and receives a load signal Sld, the serial input signal Ssi, and memory data MDa. The logic circuit unit 12a outputs the memory data MDa to be stored in an unshown memory to the flip-flop 13a, when the load signal Sld is at a High level, while the logic circuit unit 12a outputs a serial input signal Ssix to the flip-flop 13a, when the load signal Sld is at a Low level. Note that, the serial input signal Ssix serves as the serial input signal Ssi in the case of the shift register 4a. The flip-flop 13a receives the signal outputted from the logic circuit unit 12a, through a D port, latches the data in the D port at the rising edge of a clock signal Sclkx(Sx), and outputs the latched data from a Q port. Here, in the case of the shift register 4a, for example, the clock signal Sclkx(Sx) is a clock signal that is a signal Sn when the control signal Sct is in a disable state.

The signal processing unit 11b that is a signal processing unit of a second stage, is provided with a logic circuit unit 12b and a flip-flop 13b.

The logic circuit unit 12b is provided with multiple logic gates that are composed of three two-input AND circuits, for example, and receives the load signal Sld, an output signal from the flip-flop 13a, and memory data MDb. The logic circuit unit 12b outputs the memory data MDb to be stored in an unshown memory to the flip-flop 13b, when the load signal Sld is at a High level, while the logic circuit unit 12b outputs a signal outputted from the Q port of the flip-flop 13a, to the flip-flop 13b when the load signal Sld is at a Low level. The flip-flop 13b receives the signal outputted from the logic circuit unit 12b, through a D port, latches the data in the D port at the rising edge of the clock signal Sclkx(Sx), and outputs the latched data from a Q port.

The signal processing unit 11c that is a signal processing unit of a third stage, is provided with a logic circuit unit 12c and a flip-flop 13c.

The logic circuit unit 12c is provided with multiple logic gates that are composed of three two-input AND circuits, for example, and receives the load signal Sld, an output signal from the flip-flop 13b, and memory data MDc. The logic circuit unit 12c outputs the memory data MDc to be stored in an unshown memory to the flip-flop 13c, when the load signal Sld is at a High level, while the logic circuit unit 12c outputs a signal outputted from the Q port of the flip-flop 13b, to the flip-flop 13c when the load signal Sld is at a Low level. The flip-flop 13c receives the signal outputted from the logic circuit unit 12c, through a D port, latches the data in the D port at the rising edge of the clock signal Sclkx(Sx), and outputs the latched data from a Q port.

As shown in FIG. 3, a semiconductor integrated circuit 90 according to a comparative example is provided with an inverter 5a, an inverter 5b, an inverter 5c, an inverter 5(k−3), an inverter 5(k−2), an inverter 5(k−1), an inverter 5k, a shift register 4a, a shift register 4b, and a shift register 4n.

The semiconductor integrated circuit 90 according to the comparative example includes the cascade connected k inverters and the cascade connected n shift registers. The semiconductor integrated circuit 90 according to the comparative example is a semiconductor memory device having a memory and a serial input/output shift register, for example.

The inverter 5a receives a clock signal Sclk that is an input signal, and outputs a signal obtained by reversing the clock signal Sclk. The inverter 5b receives the signal outputted from the inverter 5a, and outputs a clock signal Sclk1, from a node NA2, the clock signal Sclk1 obtained by reversing the signal outputted from the inverter 5a. Note that, the clock signal Sclk1 is a signal in-phase with the clock signal Sclk. The inverter 5c receives the clock signal Sclk1 outputted from the inverter 5b, and outputs a signal obtained by reversing the clock signal Sclk1.

The inverter 5(k−3) receives a signal outputted from an unshown inverter 5(k−4) and outputs a clock signal Sclk(n−1) from a node NA(k−2), the clock signal Sclk(n−1) obtained by by reversing the signal outputted from the inverter 5(k−4). Note that, the clock signal Sclk(n−1) is a signal in-phase with the clock signal Sclk. The inverter 5(k−2) receives the clock signal Sclk(n−1) outputted from the inverter 5(k−3), and outputs a signal obtained by reversing the clock signal Sclk(n−1). The inverter 5(k−1) receives a signal outputted from the inverter 5(k−2), and outputs a clock signal Sclkn from a node NAk, the clock signal Sclkn obtained by reversing the signal outputted from the inverter 5(k−2). Note that, the clock signal Sclkn is a signal in-phase with the clock signal Sclk. The inverter 5k receives the clock signal Sclkn outputted from the inverter 5(k−1), and outputs a signal obtained by reversing the clock signal Sclkn.

The semiconductor integrated circuit 90 according to the comparative example operates normally when the clock signal Sclk is supplied to the inverter 5a. In the semiconductor integrated circuit 90 according to the comparative example, setting is not made from the outside for the potential state of an input side of each of the inverters 5a, 5b, 5c, 5(k−3), 5(k−2), 5(k−1), 5k, when the clock signal Sclk is not supplied to the inverters 5a, 5b, 5c, 5(k−3), 5(k−2), 5(k−1), 5k at the stand-by, at the time of a burn-in operation, and at other occasions.

Figure 4:
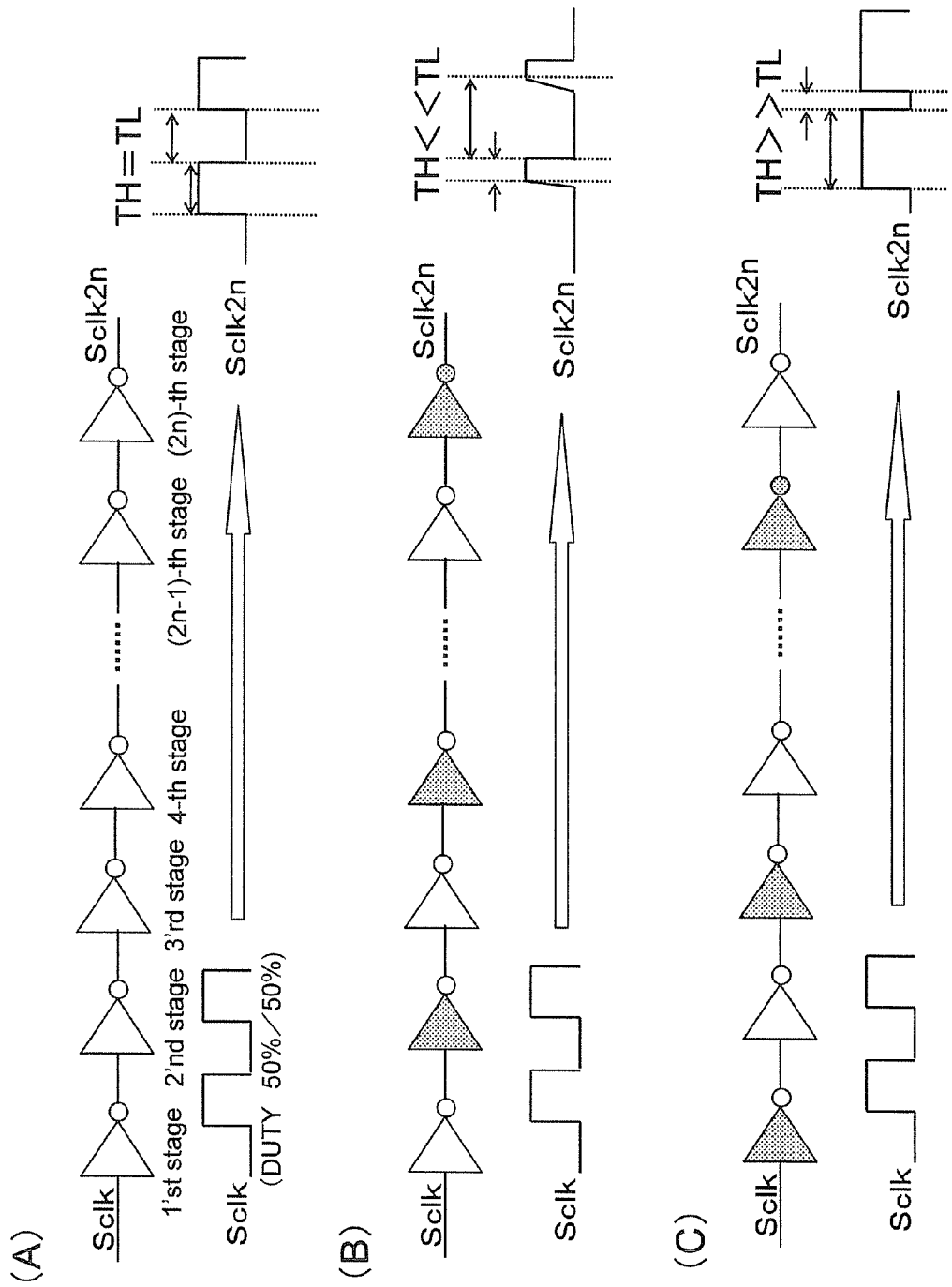
FIGS. 4A to 4C are diagrams explaining changes of a clock signal waveform generated by Vth degradation of a P-channel MOS transistor due to the NBTI according to the first embodiment of the invention.
Figure 5:
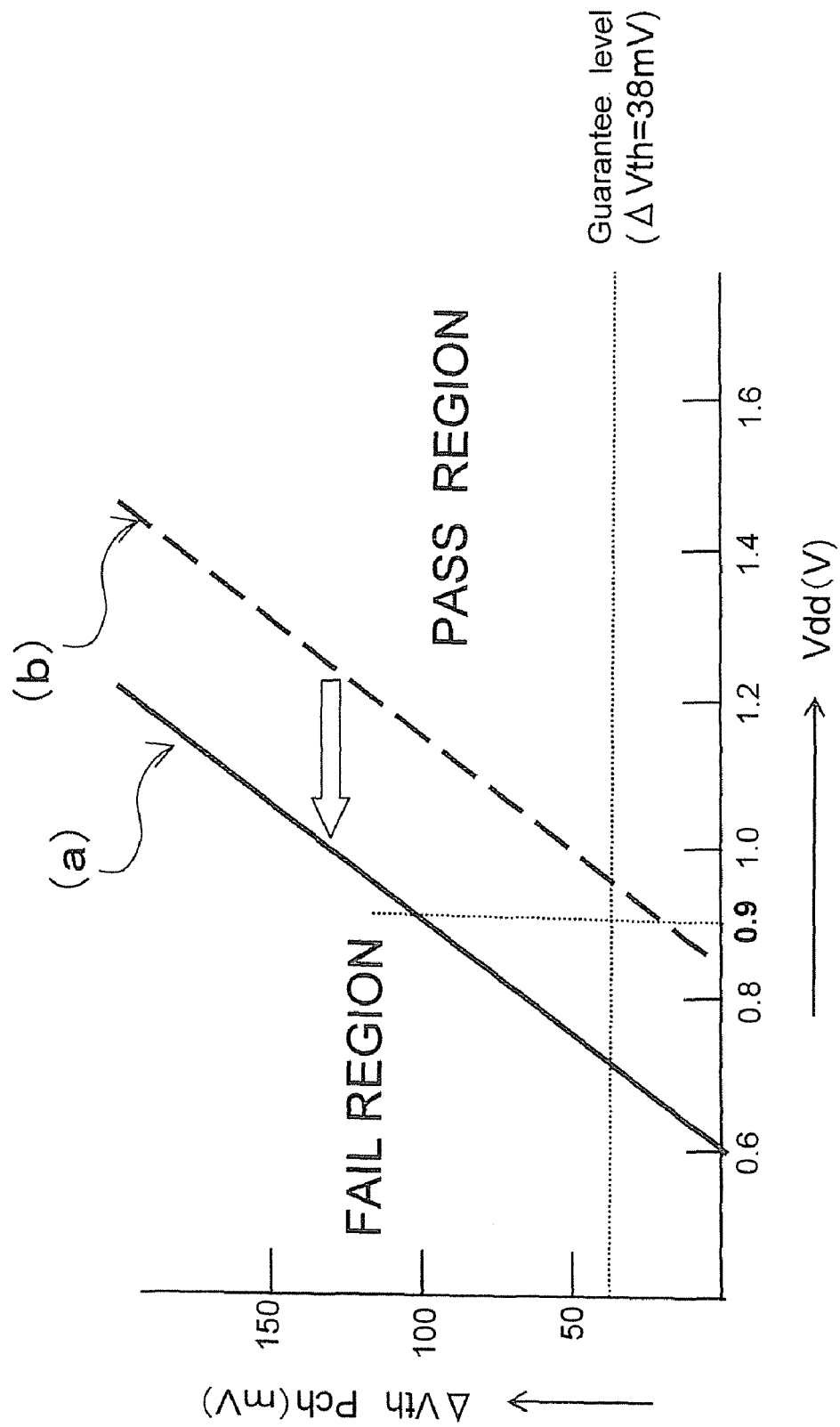
FIG. 5 is a graph showing a change of the relation between a voltage source voltage and Vth of the P-channel MOS transistor according to the first embodiment of the invention, a solid line (a) in the drawing indicates the embodiment, and a dashed line (b) in the drawing indicates the comparative example.

Next, degradation of a P-channel MOS transistor due to an NBTI mode will be described with reference to FIGS. 4A to 4C and 5. FIGS. 4A to 4C are diagrams explaining changes of a clock signal waveform generated by Vth degradation of a P-channel MOS transistor due to the NBTI mode. FIG. 4A shows a signal waveform in an initial state, FIG. 4B shows a signal waveform when the Vth in the even-numbered stages of P-channel MOS transistors are degraded, and FIG. 4C shows a signal waveform when the Vth of the odd-numbered stages of P-channel MOS transistors are degraded. FIG. 5 is a graph showing a change of the relation between a voltage source voltage and the Vth of a P-channel MOS transistor, a solid line (a) in FIG. 5 indicates the embodiment, and a dashed line (b) in FIG. 5 indicates the comparative example.

In the case of a configuration of a multiple-stage to which the clock signal Sclk is inputted, e.g., an inverter chain of a 2n-stage configuration, for example, as shown in FIG. 4A, a higher voltage source voltage Vdd is supplied to the inverter chain. At the initial time when the clock signal Sclk is inputted to an inverter in a first stage, P-channel insulated gate field effect transistors and N-channel insulated gate field effect transistors that constitute the inverter chain do not suffer from degradation in transistor characteristics due to the bias temperature instability ("BTI"). The degradation of transistor characteristics is represented by a Vth (threshold voltage) shift of an insulated gate field effect transistor. The clock signal inputted herein is a clock signal having a duty cycle of 50%, i.e. a clock signal having a high level period TH and a low level period TL that are equal to each other. Note that, an insulated gate field effect transistor is also called an MOS transistor or an MIS transistor.

Accordingly, a clock signal Sclk2n that is outputted from an inverter in a 2n−th stage that is the last stage, is in-phase with the clock signal Sclk and has the duty cycle of 50%. Note that, the in-phase means the clock signal Sclk2n is delayed by the amount of delays of the inverters.

Next, consider a case where the higher voltage source voltage Vdd is supplied to the inverter chain of the multiple-stage configuration and a High level voltage is applied to an inverter at an input side in the first stage for a long period (a case shown in FIG. 4B). In this case, the N-channel insulated gate field effect transistors of the odd-numbered stages of inverters keep on state, and the P-channel insulated gate field effect transistors of the even-numbered stages of inverters keep on state.

In each of the N-channel insulated gate field effect transistors of the odd-numbered stages of inverters, the gate becomes at a High level, and the source and the drain become at a Low level. This leads to the positive bias temperature instability ("PBTI"), thereby causing the Vth (threshold voltage) shift. On the other hand, in each of the P-channel insulated gate field effect transistors of the even-numbered stages of inverters, the gate becomes at a Low level, and the source and the drain become at a High level. This leads to the negative bias temperature instability ("NBTI"), thereby causing |Vth| increase or the Vth shift. In the miniaturized insulated gate field effect transistors that constitute the semiconductor integrated circuit 70 or the semiconductor integrated circuit 90 according to the comparative example, the relation between the NBTI and the PBTI is represented by an inequation (1).

$$\text{NBTI} \gg \text{PBTI} \quad \text{Inequation (1)}$$

Here, the Vth shift of the P-channel insulated gate field effect transistors due to the NBTI is predominant.

Accordingly, as shown in FIG. 4B, the high level period TH significantly decreases compared to the low level period TL in the clock signal Sclk2n outputted from the inverter in the last stage of the 2n-th stage. Thus, the duty cycle changes significantly. The significant change of the duty cycle of the clock signal Sclk2n affects circuits using the clock signal Sclk2n as a reference signal, including a combination circuit, such as a logic gate, and a sequential circuit, such as a flip-flop, thereby leading to the degradation in characteristic margins or the characteristic failure.

Subsequently, consider a case where the higher voltage source voltage Vdd is supplied to the inverter chain of the multiple-stage configuration and a Low level voltage is applied to an inverter at the input side in the first stage for a long period (a case shown in FIG. 4C). In this case, the P-channel insulated gate field effect transistors of the odd-numbered stages of inverters keep on state, and the N-channel insulated gate field effect transistors of the even-numbered stages of inverters keep on state.

In each of the P-channel insulated gate field effect transistors of the odd-numbered stages of inverters, the gate becomes at a Low level, and the source and the drain become at a High level. This leads to NBTI, thereby causing the Vth shift. On the other hand, in each of the N-channel insulated gate field effect transistors of the even-numbered stages of inverters, the gate becomes at a High level, and the source and the drain become at a Low level. This leads to PBTI, thereby causing the Vth shift. In the miniaturized insulated gate field effect transistors that constitute the semiconductor integrated circuit 70 or the semiconductor integrated circuit 90 according to the comparative example, the Vth shift of the P-channel insulated gate field effect transistors due to the NBTI is predominant.

Accordingly, as shown in FIG. 4C, the high level period TH significantly increases compared to the low level period TL in the clock signal Sclk2n outputted from the inverter in the last stage of the 2n-th stage. Thus, the duty cycle changes significantly. The significant change of the duty cycle of the clock signal Sclk2n affects circuits using the clock signal Sclk2n as a reference signal, including a combination circuit, such as a logic gate, and a sequential circuit, such as a flip-flop, thereby leading to the degradation in characteristic margins or the characteristic failure.

In the inverter chain of the semiconductor integrated circuit 90 according to the comparative example, an arbitrary certain voltage, such as a High level or Low level voltage, has been continuously applied to the inverter 5a in the first stage, with no clock signal Sclk supplied, at the stand-by or at the time of a burn-in test in which the higher voltage source voltage Vdd is supplied.

As a result, in the semiconductor integrated circuit 90 according to the comparative example, a PASS region is biased to a high voltage source voltage side, as shown by the dashed line (b) in FIG. 5. Here, the PASS region is represented in the relation between the higher voltage source voltage Vdd and the Vth shift (ΔVth) due to the NBTI of the P-channel insulated gate field effect transistors. The dashed line (b) in FIG. 5 indicates the boundary between the PASS region and a FAIL region, the right side of the dashed line (b) indicates the PASS region, while the left side of the dashed line (b) indicates the FAIL region, in FIG. 5.

Consider a case where a higher voltage source voltage Vdd is 0.9 V, for example. Here, the semiconductor integrated circuit 90 according to the comparative example becomes FAIL when a Vth shift (ΔVth) due to the NBTI of the P-channel insulated gate field effect transistors becomes 20 mV or more. Furthermore, when the Vth shift ΔVth is 38 mV, which is equivalent to a quality assurance level for ten years, for example, the higher voltage source voltage Vdd is 0.95 V, which is biased to a comparatively high voltage source voltage side. The above-mentioned value is highly affected by the Vth shift of the P-channel insulated gate field effect transistors that occurs when the higher voltage source voltage Vdd is supplied while the clock signal Sclk is not supplied, to the sequence of the inverters.

On the other hand, in the semiconductor integrated circuit 70 according to the embodiment, at the stand-by or at the time of a burn-in test in which the higher voltage source voltage Vdd is supplied, a low-frequency signal with a frequency lower than that of the clock signal Sclk is supplied to the inverter chain in the semiconductor integrated circuit 70. Accordingly, the P-channel and N-channel insulated gate field effect transistors that constitute the inverter repeat on and off operations. Therefore, an arbitrary certain voltage is not continuously applied to the P-channel and N-channel insulated gate field effect transistors that constitute the inverter.

As a result, as shown in the solid line (a) in FIG. 5, the PASS region, represented in the relation between the higher voltage source voltage Vdd and the Vth shift (ΔVth) due to the NBTI of the P-channel insulated gate field effect transistors, extends to a low voltage source voltage side to increase the size. The solid line (a) in FIG. 5 indicates the boundary between the PASS region and the FAIL region.

Consider a case where a higher voltage source voltage Vdd is 0.9 V, for example. Here, the semiconductor integrated circuit 70 becomes FAIL when a Vth shift (ΔVth) due to the NBTI of the P-channel insulated gate field effect transistors exceeds 100 mV which is improved to be higher by 80 mV than that in the case of the semiconductor integrated circuit 90 according to the comparative example. Furthermore, when the Vth shift ΔVth is 38 mV, which is equivalent to a quality assurance level for ten years, for example, the higher voltage source voltage Vdd is 0.7 V, which is improved to be less by 0.25 V than that in the case of the semiconductor integrated circuit 90 according to the comparative example, by being shifted to the low voltage source voltage side.

As described above, the semiconductor integrated circuit according to the embodiment is provided with the multiplexer 1, the signal generating circuit 2, the control circuit 3, the sequence of the m inverters 5a to 5m, the n two-input NOR circuits 6a to 6n, and the cascade connected n two-shift registers 4a to 4n. The control circuit 3 generates a control signal Sct in the disable state in a normal operation in which the clock signal Sclk is supplied. The control circuit 3 generates a control signal Sct in an enable state in the other-than-normal operation in which the higher voltage source voltage Vdd is supplied while the clock signal Sclk is not supplied. The multiplexer 1 receives the clock signal Sclk and the low-frequency signal Ssg outputted from the signal generating circuit 2. The multiplexer 1 supplies the clock signal Sclk to the sequence of the inverters 5a to 5m upon receipt of the control signal Sct in the disable state, and supplies the low-frequency signal Ssg to the sequence of the inverters 5a to 5m upon receipt of the control signal Sct in the enable state.

In this manner, in the other-than-normal operation in which the higher voltage source voltage Vdd is supplied while the clock signal Sclk is not supplied, the P-channel and N-channel insulated gate field effect transistors that constitute the sequence of the inverters 5a to 5m operate on and off at a low speed. Accordingly, a certain voltage is not continuously applied to the gates of the P-channel and N-channel insulated gate field effect transistors for a long period. This makes it possible to prevent the increase in the Vth shift of the P-channel insulated gate field effect transistor due to the NBTI significantly. Furthermore, this also makes it possible to prevent the increase in the Vth shift of the N-channel insulated gate field effect transistor due to the PBTI significantly. Therefore, the characteristic degradation, the operation failure, or the like of the semiconductor integrated circuit 70 due to the BTI can be reduced, thereby achieving the highly reliable semiconductor integrated circuit 70.

Note that, in the embodiment, the clock signal Sclk is inputted to the sequence of the inverters 5a to 5m, but the signal is not necessarily limited to this. Alternatively, the invention is also applicable to a case where a data-processed data signal or an oscillation signal is inputted as an input signal, for example. Furthermore, in the embodiment, the clock signal Sclk is in-phase with a clock signal to be inputted to the shift registers 4, but the configuration is not necessarily limited to this. Alternatively, a clock signal in opposite phase with the clock signal Sclk may be inputted to the shift registers 4, for example. In this case, the inverters are constituted in the even-numbered stages.

Figure 6:
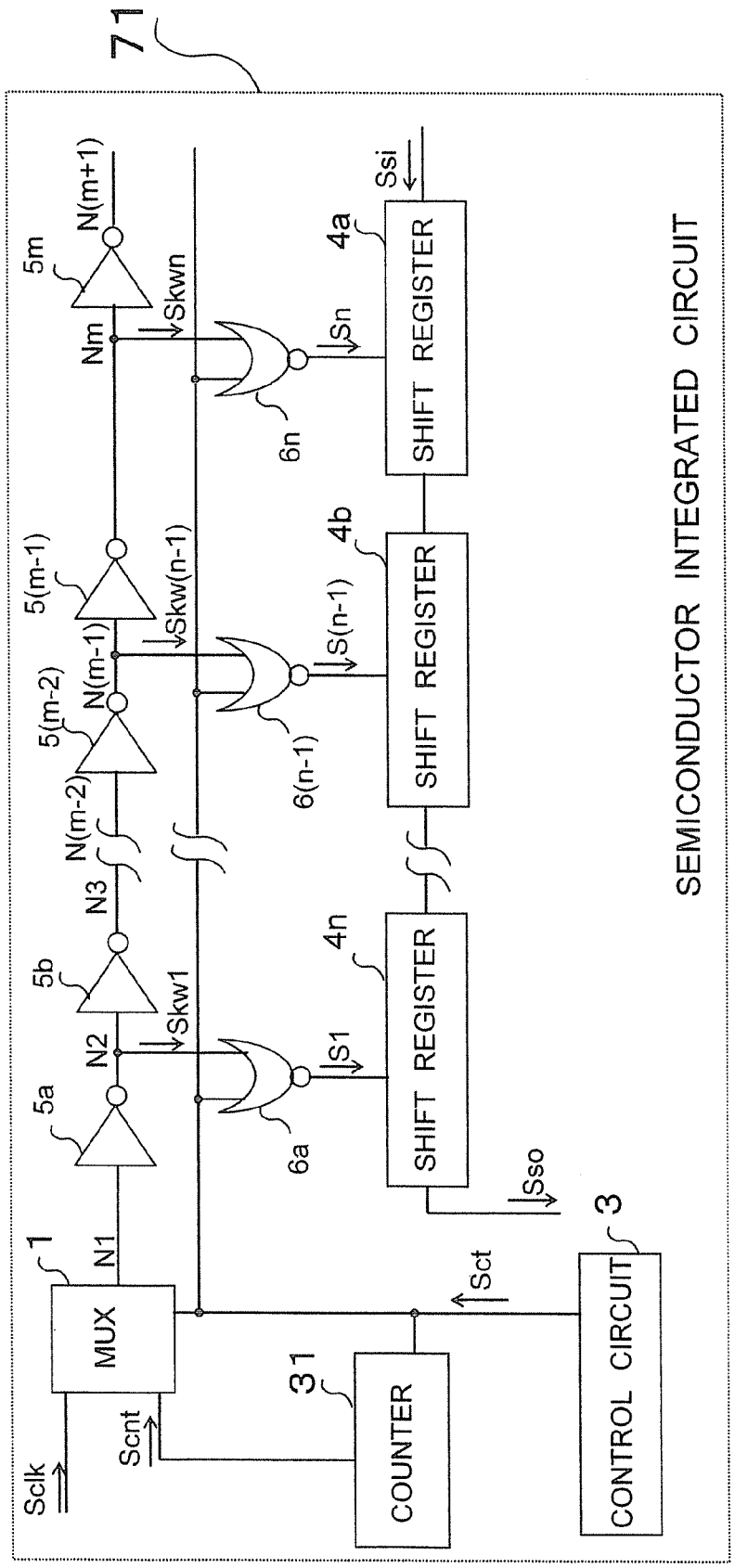
FIG. 6 is a circuit diagram showing a semiconductor integrated circuit according to a second embodiment of the invention.
Figure 7:
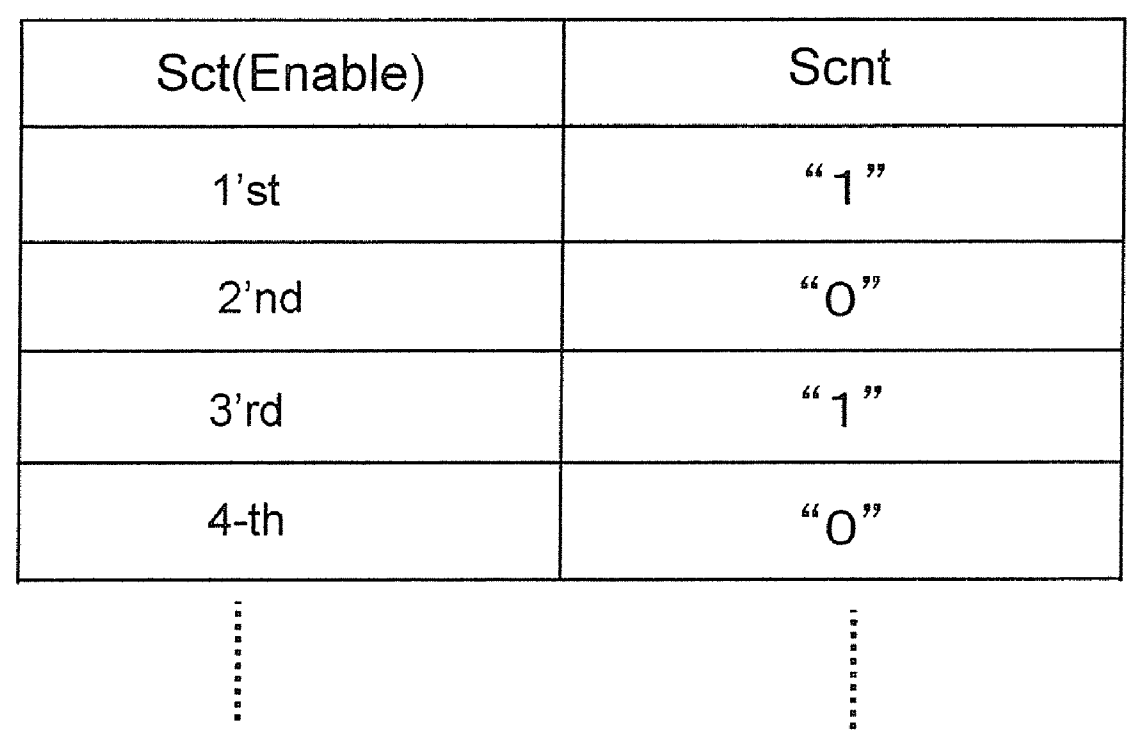

A semiconductor integrated circuit according to a second embodiment of the invention will be described with reference to the drawings. FIG. 6 is a circuit diagram showing a semiconductor integrated circuit, and FIG. 7 is a table explaining operations of a counter. In the embodiment, a signal of 1 or 0 (zero) is alternately inputted to an inverter every time a clock signal is not inputted to the inverter.

The same numerals are given to the same portions as the first embodiment, and the description of the same portions will be omitted below. Only the different portions will be described.

As shown in FIG. 6, a semiconductor integrated circuit 71 is provided with a multiplexer 1, a control circuit 3, a counter 31, an inverter 5a, an inverter 5b, an inverter 5(m−2), an inverter 5(m−1), an inverter 5m, a two-input NOR circuit 6a, a two-input NOR circuit 6(n−1), a two-input NOR circuit 6n, a shift register 4a, a shift register 4b, and a shift register 4n.

The semiconductor integrated circuit 71 includes the m inverters, the n two-input NOR circuits, and the n shift registers. The semiconductor integrated circuit 71 is a semiconductor memory device having a memory and a serial input/output shift register, for example. A clock signal Sclk is supplied to the semiconductor integrated circuit 71 in the normal operation.

In the semiconductor integrated circuit 71, when a control signal Sct is in an enable state (a value of "1", for example), the clock signal Sclk is not inputted to the shift registers 4n, . . . , 4b, 4a in the same manner as the first embodiment. In this event, a count signal Scnt, which is described later, is not inputted to the shift registers 4n, . . . , 4b, 4a either, whereas a signal having a certain value of "0" (zero) is inputted to the shift registers 4n, . . . , 4b, 4a.

The counter 31 receives the control signal Sct, and alternately generates a count signal Scnt having a value either 1 or 0 (zero) based on the control signal Sct every time the clock signal Sclk is not supplied. Note that, the time when the clock signal Sclk is not supplied is a pause between repeated processing cycles. Specifically, after the clock signal Sclk is supplied to the semiconductor integrated circuit and the semiconductor integrated circuit 71 operates normally, the supply of the clock signal Sclk is put into a pause for a certain period.

Then, the clock signal Sclk is supplied again, and thereafter, the supply of the clock signal Sclk is again put into a pause for a certain period.

The multiplexer 1 is also called a data selector, and receives the clock signal Sclk, the count signal Scnt, and the control signal Sct. The multiplexer 1 selects and outputs the clock signal Sclk from the node N1 upon receipt of the control signal Sct in the disable state (a value of "0" (zero), for example), and selects and outputs the count signal Scnt from the node N1 upon receipt of the control signal Sct in the enable state (a value of "1", for example).

Consider specific cases based on the table in FIG. 7. In the semiconductor integrated circuit 71, after a first normal operation of the semiconductor integrated circuit 71 in which a control signal Sct is in a disable state (a value of "0" (zero), for example), when the control signal Sct is in a first enable state (a value of "1", for example), the counter 31 outputs a count signal Sent of a value of "1" to the multiplexer 1. When the control signal Sct is in the first enable state (a value of "1", for example), each odd number node has a signal of a value of "1", and each even number node has a signal of a value of "0". A signal Skw1 of the node N2 has a value of "0", for example.

Next, in the semiconductor integrated circuit 71, after a second normal operation of the semiconductor integrated circuit 71 in which a control signal Sct is in a disable state (a value of "0" (zero), for example), when the control signal Sct is in a second enable state (a value of "1", for example), the counter 31 outputs a count signal Scnt of a value of "0" to the multiplexer 1. When the control signal Sct is in the second enable state (a value of "1", for example), each odd number node has a signal of a value of "0", and each even number node has a signal of a value of "1". A signal Skw1 of the node N2 has a value of "1", for example.

Subsequently, in the semiconductor integrated circuit 71, after a third normal operation of the semiconductor integrated circuit 71 in which a control signal Sct is in a disable state (a value of "0" (zero), for example), when the control signal Sct is in a third enable state (a value of "1", for example), the counter 31 outputs a count signal Scnt of a value of "1" to the multiplexer 1. When the control signal Sct is in the third enable state (a value of "1", for example), each odd number node has a signal of a value of "1", and each even number node has a signal of a value of "0". A signal Skw1 of the node N2 has a value of "0", for example.

Then, in the semiconductor integrated circuit 71, after a fourth normal operation of the semiconductor integrated circuit 71 in which a control signal Sct is in a disable state (a value of "0" (zero), for example), when the control signal Sct is in a fourth enable state (a value of "1", for example), the counter 31 outputs a count signal Scnt of a value of "0" to the multiplexer 1. When the control signal Sct is in the fourth enable state (a value of "1", for example), each odd number node has a signal of a value of "0", and each even number node has a signal of a value of "1". A signal Skw1 of the node N2 has a value of "1", for example.

From then on, a value of a signal of the count signal Scnt alternately changes between "1" and "0" every time the control signal Sct in the enable state is updated.

As described above, the semiconductor integrated circuit according to the embodiment is provided with the multiplexer 1, the control circuit 3, the counter 31, the sequence of the m inverters 5a to 5m, the n two-input NOR circuits 6a to 6n, and the cascade connected n two-shift registers 4a to 4n. The control circuit 3 generates a control signal Sct in the disable state in a normal operation in which the clock signal Sclk is supplied, and generates a control signal Sct in the enable state in an other-than-normal operation in which the higher voltage source voltage Vdd is supplied while the clock signal Sclk is not supplied. The counter 31 alternately generates a count signal Scnt having a value either 1 or 0 (zero) every time the clock signal Sclk is not supplied. The multiplexer 1 receives the clock signal Sclk and the count signal Scnt The multiplexer 1 supplies the clock signal Sclk to the sequence of the inverters 5a to 5m upon receipt of the control signal Sct in the disable state. The multiplexer 1 supplies the count signal Scnt to the sequence of the inverters 5a to 5m upon receipt of the control signal Sct in the enable state.

In this manner, in the other-than-normal operation in which the higher voltage source voltage Vdd is supplied while the clock signal Sclk is not supplied, the even-numbered stages of P-channel insulated gate field effect transistors or the odd-numbered stages and the odd-numbered stages of N-channel insulated gate field effect transistors or the even-numbered stages that constitute the sequence of the inverters 5a to 5m alternately turn on every time the clock signal Sclk is not supplied. Accordingly, a certain voltage is not continuously applied to the gates of the P-channel and N-channel insulated gate field effect transistors for a long period. This makes it possible to prevent the increase in the Vth shift of the P-channel insulated gate field effect transistor due to the NBTI significantly. Furthermore, this also makes it possible to prevent the increase in the Vth shift of the N-channel insulated gate field effect transistor due to the PBTI significantly. Therefore, the characteristic degradation, the operation failure, or the like of the semiconductor integrated circuit 71 due to the BTI can be reduced, thereby achieving the highly reliable semiconductor integrated circuit 71.

Figure 8:
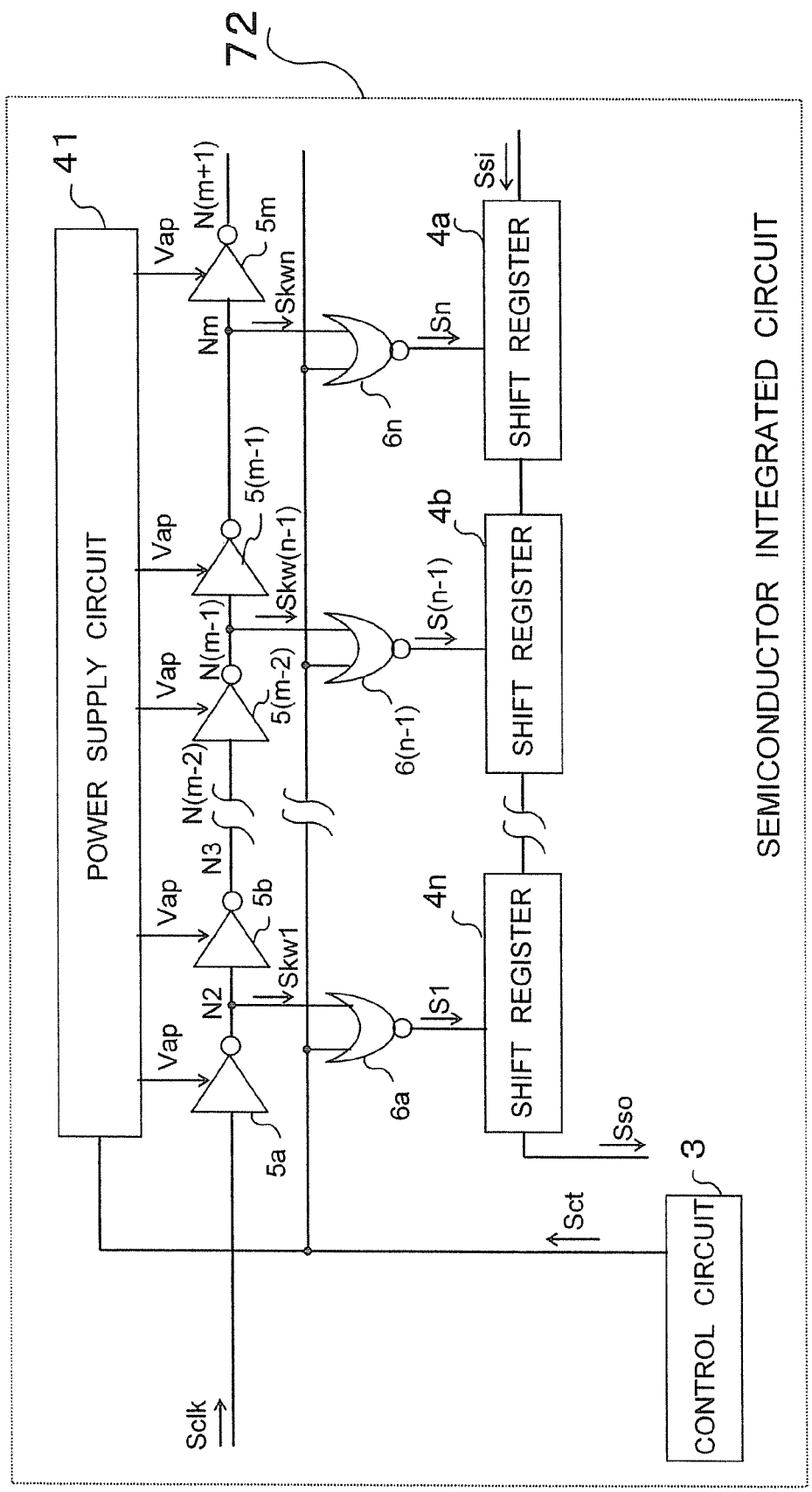
FIG. 8 is a circuit diagram showing a semiconductor integrated circuit according to a third embodiment of the invention.

A semiconductor integrated circuit according to a third embodiment of the invention will be described with reference to the drawings. FIG. 8 is a circuit diagram showing a semiconductor integrated circuit. In the embodiment, the supply of a higher voltage source voltage to the inverter is put into a pause when a clock signal is not inputted to the inverter.

The same numerals are given to the same portions as the first embodiment, and the description of the same portions will be omitted below. Only the different portions will be described.

As shown in FIG. 8, a semiconductor integrated circuit 72 is provided with a control circuit 3, a power supply circuit 41, an inverter 5a, an inverter 5b, an inverter 5(m−2), an inverter 5(m−1), an inverter 5m, a two-input NOR circuit 6a, a two-input NOR circuit 6(n−1), a two-input NOR circuit 6n, a shift register 4a, a shift register 4b, and a shift register 4n.

The semiconductor integrated circuit 72 includes the m inverters, the n two-input NOR circuits, and the n shift registers. The semiconductor integrated circuit 72 is a semiconductor memory device having a memory and a serial input/output shift register, for example.

The power supply circuit 41 receives a control signal Sct. The power supply circuit 41 supplies a voltage Vap that is the higher voltage source voltage Vdd, to each of the cascade connected m inverters 5a, 5b, . . . , 5(m−2), 5(m−1), 5m, upon receipt of the control signal Sct in the disable state (a value of "0" (zero), for example). The power supply circuit 41 puts the supply of the voltage Vap to each of the cascade connected m inverters 5a, 5b, . . . , 5(m−2), 5(m−1), 5m, into a pause upon receipt of the control signal Sct in the enable state (a value of "1", for example).

In other words, when the control signal Sct is in a disable state (a value of "0" (zero), for example), the inverter 5a, the inverter 5b, . . . , the inverter 5(m−2), the inverter 5(m−1), the inverter 5m, the shift register 4n, . . . , the shift register 4b, and the shift register 4a operate normally. When the control signal Sct is in an enable state (a value of "1", for example), the cascade connected m inverters 5a, 5b, . . . , 5(m-2), 5(m-1), 5m stop the operations, and the shift register 4n, . . . , the shift register 4b, and the shift register 4a do not receive the clock signal Sclk but receive a signal of a certain value of "0" (zero). Accordingly, the shift register 4n, . . . , the shift register 4b, and the shift register 4a do not operate, so that no error operation occurs.

As described above, the semiconductor integrated circuit according to the embodiment is provided with the control circuit 3, the power supply circuit 41, the sequence of the m inverters 5a to 5m, the n two-input NOR circuits 6a to 6n, the cascade connected n two-shift registers 4a to 4n. The control circuit 3 generates a control signal Sct in the disable state in a normal operation in which the clock signal Sclk is supplied, and generates a control signal Sct in the enable state in the other-than-normal operation in which the higher voltage source voltage Vdd is supplied while the clock signal Sclk is not supplied. The power supply circuit 41 supplies a voltage Vap that is the higher voltage source voltage Vdd, to the sequence of the m inverters 5a to 5m upon receipt of the control signal Sct in the disable state, and puts the supply of the voltage Vap to the sequence of the m inverters 5a to 5m into a pause upon receipt of the control signal Sct in the enable state.

Accordingly, in the other-than-normal operation, the P-channel and N-channel insulated gate field effect transistors that constitute the sequence of the inverters 5a to 5m turn off. Here, since the higher voltage source voltage Vdd is not supplied to the P-channel and N-channel insulated gate field effect transistors, a certain voltage is not applied to the P-channel and N-channel insulated gate field effect transistors for a long period. This makes it possible to prevent the increase in the Vth shift of the P-channel insulated gate field effect transistor due to the NBTI significantly. Furthermore, this also makes it possible to prevent the increase in the Vth shift of the N-channel insulated gate field effect transistor due to the PBTI significantly Therefore, the characteristic degradation, the operation failure, or the like of the semiconductor integrated circuit 72 due to the BTI can be reduced, thereby achieving the highly reliable semiconductor integrated circuit 72.

Figure 9:
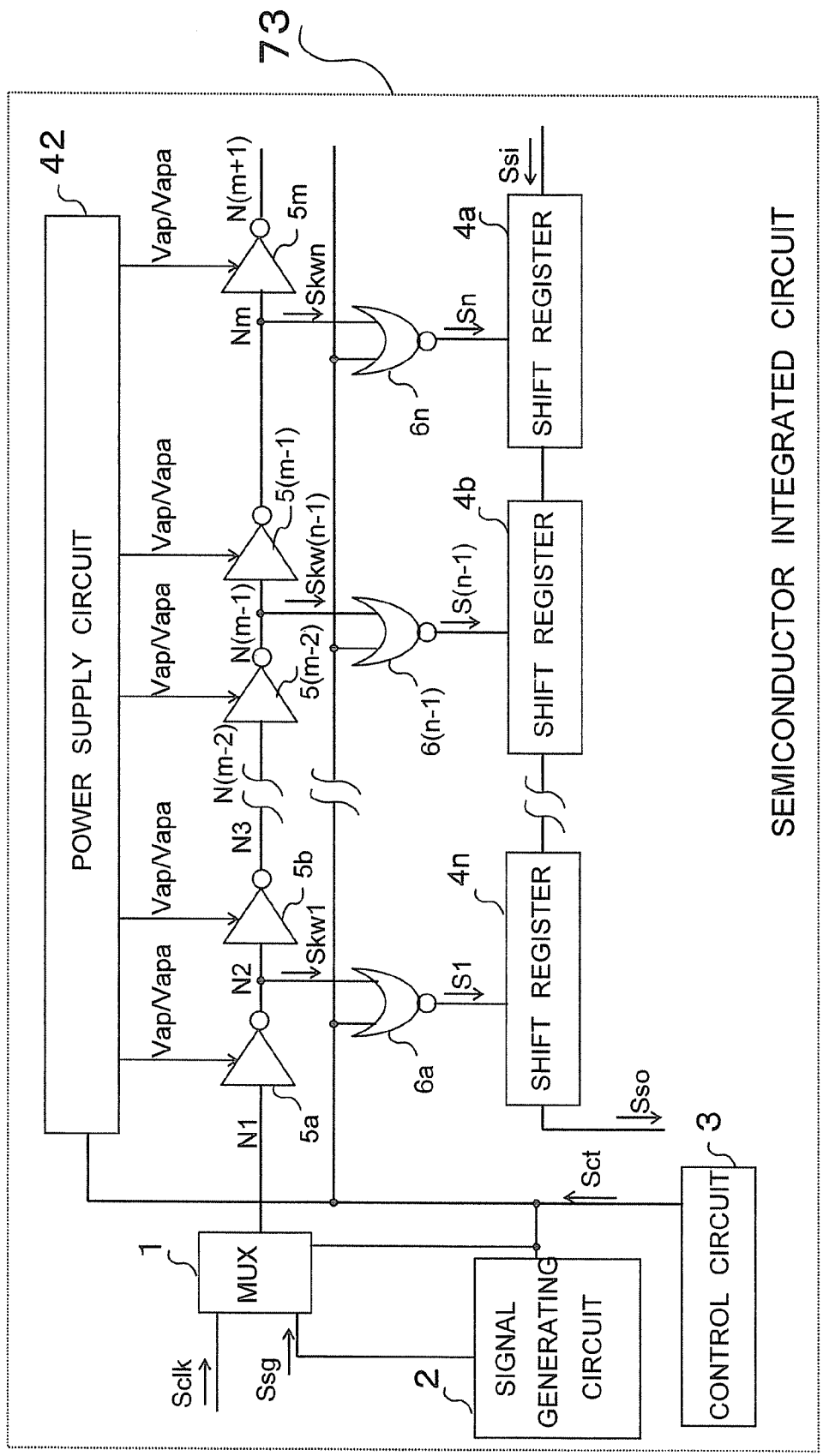
FIG. 9 is a circuit diagram showing a semiconductor integrated circuit according to a fourth embodiment of the invention.

A semiconductor integrated circuit according to a fourth embodiment of the invention will be described with reference to the drawings. FIG. 9 is a circuit diagram showing a semiconductor integrated circuit. In the embodiment, when a clock signal is not inputted to an inverter, a low-frequency signal with a frequency lower than that of the clock signal is inputted to the inverter and a voltage source voltage to be supplied to the inverter is lowered.

The same numerals are given to the same portions as the first embodiment, and the description of the same portions will be omitted below. Only the different portions will be described.

As shown in FIG. 9, a semiconductor integrated circuit 73 is provided with a multiplexer 1, a signal generating circuit 2, a control circuit 3, a power supply circuit 42, an inverter 5a, an inverter 5b, an inverter 5(m-2), an inverter 5(m-1), an inverter 5m, a two-input NOR circuit 6a, a two-input NOR circuit 6(n-1), a two-input NOR circuit 6n, a shift register 4a, a shift register 4b, and a shift register 4n.

The semiconductor integrated circuit 73 includes the m inverters, the n two-input NOR circuits, and the n shift registers. The semiconductor integrated circuit 73 is a semiconductor memory device having a memory and a serial input/output shift register, for example.

The power supply circuit 42 receives a control signal Sct. The power supply circuit 42 supplies a voltage Yap that is the higher voltage source voltage Vdd, to each of the m cascade connected inverters 5a, 5b, . . . , 5(m-2), 5(m-1), 5m upon receipt of the control signal Sct in the disable state (a value of "0" (zero), for example), and supplies a voltage Vapa that is a voltage lower than the higher voltage source voltage Vdd, to each of the m cascade connected inverters 5a, 5b, . . . , 5(m-2), 5(m-1), 5m upon receipt of the control signal Sct in the enable state (a value of "1", for example).

When the control signal Sct is in a disable state (a value of "0" (zero), for example), the inverter 5a, the inverter 5b, . . . , the inverter 5(m-2), the inverter 5(m-1), the inverter 5m, the shift register 4n, . . . , the shift register 4b, and the shift register 4a operate normally.

When the control signal Sct is in an enable state (a value of "1", for example), the inverter 5a, the inverter 5b, . . . , the inverter 5(m-2), the inverter 5(m-1), and the inverter 5m operate at a low speed with low power consumption because of the low voltage source voltage and the low-frequency signal. When the control signal Sct is in an enable state (a value of "1", for example), the shift register 4n, . . . , the shift register 4b, and the shift register 4a do not receive the clock signal Sclk but receive a signal of a certain value of "0" (zero), and therefore do not operate, leading to error-free operation.

As described above, the semiconductor integrated circuit according to the embodiment is provided with the multiplexer 1, the signal generating circuit 2, the control circuit 3, the power supply circuit 42, the sequence of the m inverters 5a to 5m, the n two-input NOR circuits 6a to 6n, and the cascade connected n two-shift registers 4a to 4n. The control circuit 3 generates a control signal Sct in the disable state in a normal operation in which the clock signal Sclk is supplied, and generates a control signal Sct in an enable state in the other-than-normal operation in which the higher voltage source voltage Vdd is supplied while the clock signal Sclk is not supplied. The power supply circuit 42 supplies a voltage Vap that is the higher voltage source voltage Vdd to the sequence of m inverters 5a to 5m upon receipt of the control signal Sct in the disable state, and supplies a voltage Vapa which is lower than the voltage Vap, to the sequence of the m inverters 5a to 5m upon receipt of the control signal Sct in the enable state. The multiplexer 1 receives the clock signal Sclk and the low-frequency signal Ssg outputted from the signal generating circuit 2. The multiplexer 1 supplies the clock signal Sclk to the sequence of the inverters 5a to 5m upon receipt of the control signal Sct in the disable state, and supplies the low-frequency signal Ssg to the sequence of the inverters 5a to 5m upon receipt of the control signal Sct in the enable state.

In this manner, in the operations other than the normal operation, the P-channel and N-channel insulated gate field effect transistors that constitute the sequence of the inverters 5a to 5m operate on and off at a low speed with a low voltage. Accordingly, a certain voltage is not applied to the gates of the P-channel and N-channel insulated gate field effect transistors for a long period. This makes it possible to prevent the increase in the Vth shift of the P-channel insulated gate field effect transistor due to the NBTI significantly. Furthermore, this also makes it possible to prevent the increase in the Vth shift of the N-channel insulated gate field effect transistor due to the PBTI significantly. Therefore, the characteristic degradation, the operation failure, or the like of the semiconductor integrated circuit 73 due to the BTI can be reduced, thereby achieving the highly reliable semiconductor integrated circuit 73.

Figure 10:
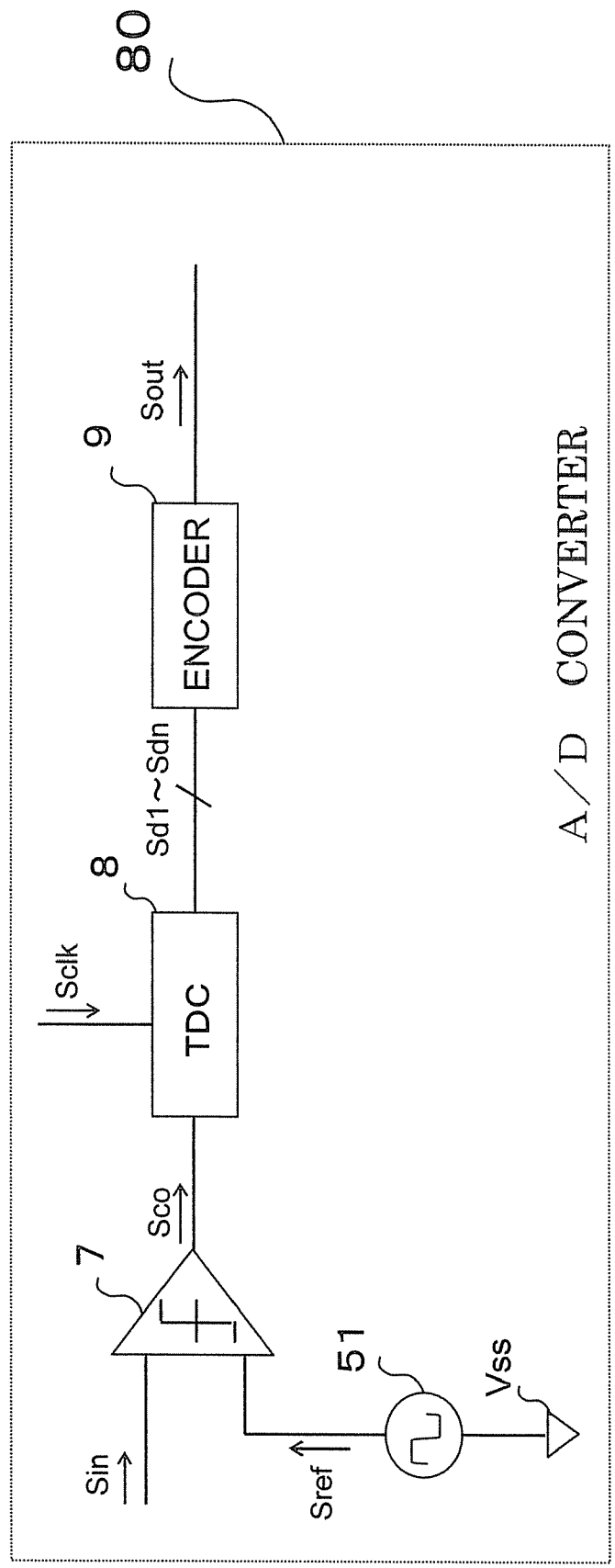
FIG. 10 is a diagram showing an A/D converter according to a fifth embodiment of the invention.
Figure 11:
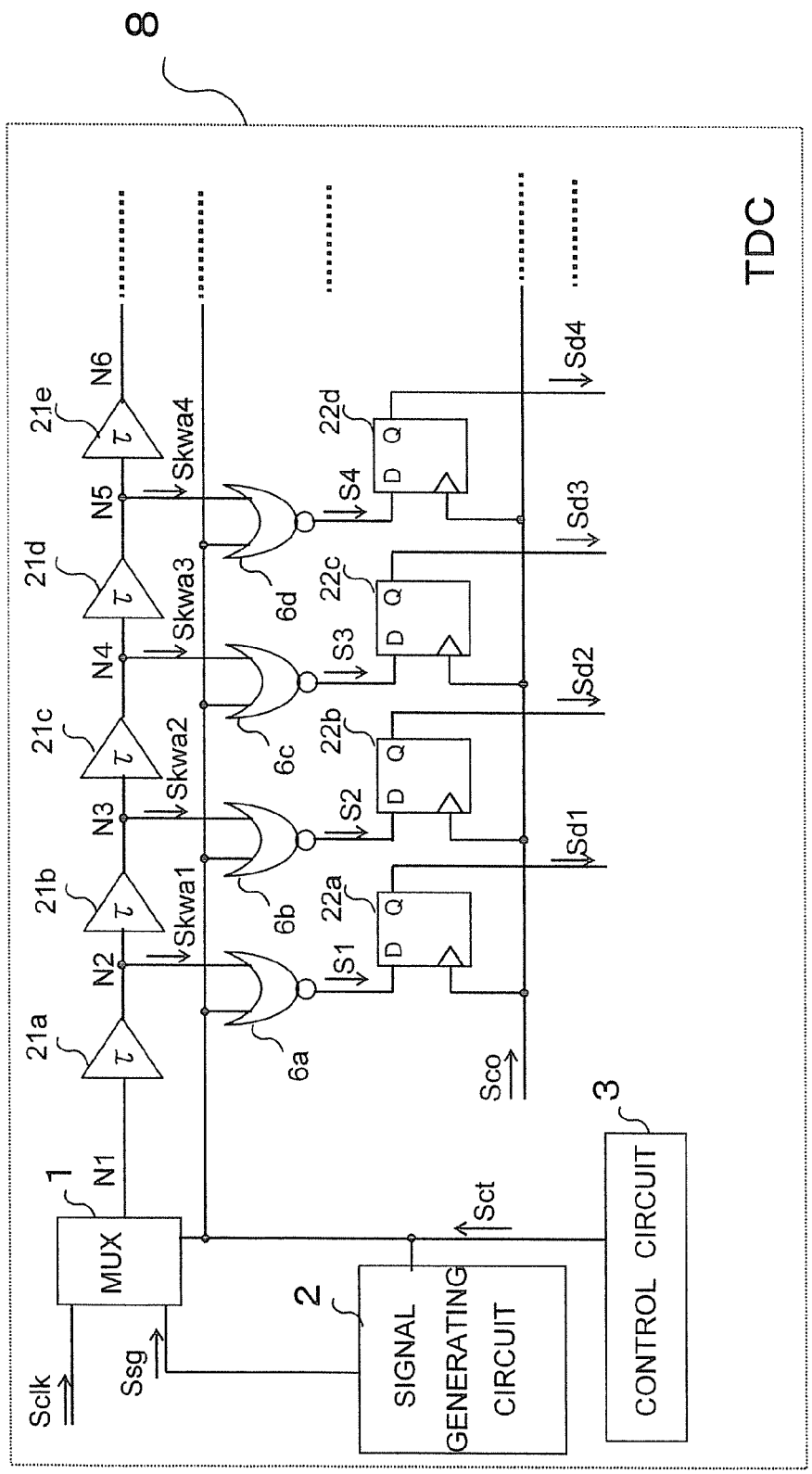
FIG. 11 is a circuit diagram showing a TDC as a semiconductor integrated circuit according to the fifth embodiment of the invention.
Figure 12:
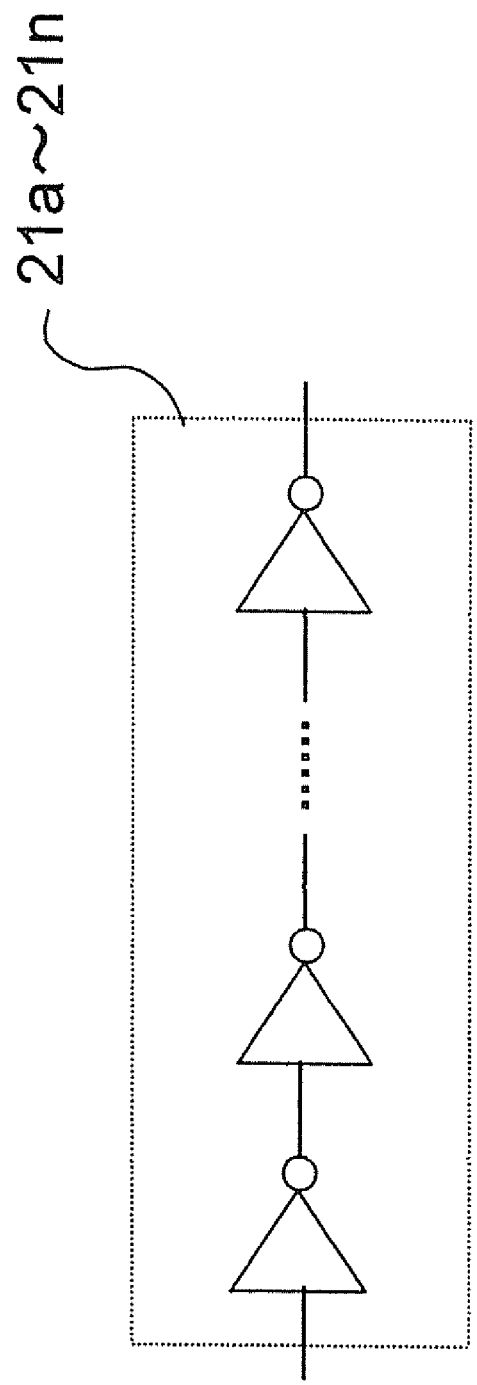
FIG. 12 is a circuit diagram showing a delay circuit according to the fifth embodiment the invention.

A semiconductor integrated circuit according to a fifth embodiment of the invention will be described with reference to the drawings. FIG. 10 is a circuit diagram showing an A/D converter, FIG. 11 is a circuit diagram showing a time to digital converter ("TDC") as a semiconductor integrated circuit, and FIG. 12 is a circuit diagram showing a delay circuit. In the embodiment, when a clock signal is not inputted to the delay circuit provided in the TDC, a low-frequency signal with a frequency lower than that of the clock signal is inputted to the delay circuit. Analog processing is performed in the embodiment.

The same numerals are given to the same portions as the first embodiment, and the description of the same portions will be omitted below. Only the different portions will be described.

As shown in FIG. 10, an A/D converter 80 is provided with a signal generating circuit 51, a comparator 7, a TDC 8, and an encoder 9. The A/D converter 80 is a time-resolved A/D converter using the TDC 8. The A/D converter 80 performs high-speed sampling processing by using the TDC 8 with high temporal resolution and a reference cosine wave signal Sref that is a reference signal generated in the signal generating circuit 51.

The signal generating circuit 51 is formed of a ΣΔD/A converter, for example, is provided between the comparator 7 and a lower voltage source (ground potential) Vss, and outputs the reference cosine wave signal Sref to the comparator 7.

The comparator 7 is provided between the signal generating circuit 51 and the TDC 8, receives an input signal Sin that is an analog signal and the reference cosine wave signal Sref, and outputs a comparator output signal Sco to the TDC 8, the comparator output signal Sco obtained by converting the voltage into a signal on the time axis.

The TDC 8 as a semiconductor integrated circuit is provided between the comparator 7 and the encoder 9, receives the comparator output signal Sco and the clock signal Sclk, digitally processes the signals on the time axis, and outputs digital output signals Sd1 to Sdn to the encoder 9. Although applied to the A/D converter 80 in FIG. 10, the TDC 8 may be applied to a phase comparator or a modem circuit that is provided in an ADPLL (All Digital Phase locked Loop) circuit that digitally processes every processing, alternatively.

As shown in FIG. 11, the TDC 8 is provided with a multiplexer 1, a signal generating circuit 2, a control circuit 3, a delay circuit 21a, a delay circuit 21b, a delay circuit 21c, a delay circuit 21d, a delay circuit 21e, the two-input NOR circuit 6a, a two-input NOR circuit 6b, a two-input NOR circuit 6c, a two-input NOR circuit 6d, a flip-flop 22a, a flip-flop 22b, a flip-flop 22c, and a flip-flop 22d. All portions included in the TDC 8 are not shown. However, n delay circuits 21, n input NOR circuits 6, and n flip-flops 22 are arranged in the TDC 8.

As shown in FIG. 12, each of the delay circuits 21a to 21n is provided with inverters having the odd-numbered stages, reverses the clock signal to be inputted, and delays the clock signal for a certain period of time. The time to be delayed by each of the delay circuits 21a to 21n is set as appropriate in accordance with the temporal resolution that is required to the TDC 8.

The delay circuit 21a is provided between the multiplexer 1 and the delay circuit 21b. The delay circuit 21a is provided between the multiplexer 1 and the two-input NOR circuit 6a (between the node N1 and the node N2). The delay circuit 21a receives a signal of the node N1 outputted from the multiplexer 1, and output a signal Skwa1 from the node N2, the signal Skwa1 obtained by reversing the signal of the node N1 and delaying the reversed signal by a predetermined period of time. The delay circuit 21a receives the clock signal Sclk when the A/D converter 80 operates normally and the control signal Sct is in a disable state (a value of "0" (zero), for example). The delay circuit 21a receives the low-frequency signal Ssg with a frequency lower than one-tenth of the clock signal Sclk when the A/D converter 80 is in the other-than-normal operation and the control signal Sct is in an enable state (a value of "1", for example).

The delay circuit 21b is provided between the node N2 and the node N3, receives the signal of the node N2 outputted from the delay circuit 21a, and outputs a signal Skwa2 from the node N3, the signal Skwa2 obtained by reversing the signal of the node N2 and delaying the reversed signal by a predetermined period of time. The delay circuit 21b receives the delayed clock signal Sclk when the control signal Sct is in a disable state. The delay circuit 21b receives the delayed low-frequency signal Ssg when the control signal Sct is in an enable state.

The delay circuit 21c is provided between the node N3 and a node N4, receives the signal of the node N3 outputted from the delay circuit 21b, and outputs a signal Skwa3 from the node N4, the signal Skwa3 obtained by reversing the signal of the node N3 and delaying the reversed signal by a predetermined period of time. The delay circuit 21c receives the delayed clock signal Sclk when the control signal Sct is in a disable state. The delay circuit 21c receives the delayed low-frequency signal Ssg when the control signal Sct is in an enable state.

The delay circuit 21d is provided between the node N4 and a node N5, receives the signal of the node N4 outputted from the delay circuit 21c, and outputs a signal Skwa4 from the node N5, the signal Skwa4 obtained by reversing the signal of the node N4 and delaying the reversed signal by a predetermined period of time. The delay circuit 21d receives the delayed clock signal Sclk when the control signal Sct is in a disable state. The delay circuit 21d receives the delayed low-frequency signal Ssg when the control signal Sct is in an enable state.

The delay circuit 21e is provided between the node N5 and a node N6, receives the signal of the node N5 outputted from the delay circuit 21d, and outputs an unshown signal Skwa5 from the node N6, the signal Skwa5 obtained by reversing the signal of the node N5 and delaying the reversed signal by a predetermined period of time. The delay circuit 21e receives the delayed clock signal Sclk when the control signal Sct is in a disable state. The delay circuit 21e receives the delayed low-frequency signal Ssg when the control signal Sct is in an enable state.

The two-input NOR circuit 6a receives the control signal Sct and the signal Skwa1, and outputs a signal S1 that is a logically operated signal to the flip-flop 22a. When the control signal Sct in the disable state, the signal S1 is delayed for a predetermined period of time, and becomes a clock signal in-phase with the clock signal Sclk. When the control signal Sct is in an enable state, the signal S1 maintains a Low level (a value of 0 (zero)) and the delayed clock signal is not inputted to the flip-flop 22a.

The two-input NOR circuit 6b receives the control signal Sct and the signal Skwa2, and outputs a signal S2 that is a logically operated signal to the flip-flop 22b. When the control signal Sct is in a disable state, the signal 82 is delayed for a predetermined period of time, and becomes a clock signal in-phase with the clock signal Sclk. Note that, the signal S2 is delayed more than the signal S1 is. When the control signal Sct is in an enable state, the signal S2 maintains a Low level (a value of 0 (zero)) and thus the delayed clock signal is not inputted to the flip-flop 22b.

The two-input NOR circuit 6c receives the control signal Sct and the signal Skwa3, and outputs a signal S3 that is a logically operated signal to the flip-flop 22c. When the control signal Sct is in a disable state, the signal S3 is delayed for a predetermined period of time, and becomes a clock signal in-phase with the clock signal Sclk. Note that, the signal S3 is delayed more than the signal S2 is. When the control signal Sct is in an enable state, the signal 83 maintains a Low level (a value of 0 (zero)) and thus the delayed clock signal is not inputted to the flip-flop 22c.

The two-input NOR circuit 6d receives the control signal Sct and the signal Skwa4, and outputs a signal S4 that is a logically operated signal to the flip-flop 22d. When the control signal Sct is in a disable state, the signal S4 is delayed for a predetermined period of time (delayed more than the signal S3 is), and becomes a clock signal in-phase with the clock signal Sclk. Note that, the signal S4 is delayed more than the signal S3 is. When the control signal Sct is in an enable state, the signal S4 maintains a Low level (a value of 0 (zero)) and thus the delayed clock signal is not inputted to the flip-flop 22d.

The flip-flop 22a receives the signal S1 at a D port, latches the data in the D port at the rising edge of the comparator output signal Sco, and outputs the latched data from a Q port as a digital output signal Sd1. When the A/D converter 80 is in a normal operation and the control signal Sct is in a disable state, the flip-flop 22a measures a signal on the time axis as a voltage digital signal, and outputs the signal as the digital output signal Sd1. When the A/D converter 80 is in the other-than-normal operation and the control signal Sct is in an enable state, the flip-flop 22a receives only the signal of a value of "0", and thus does not measure a signal on the time axis.

The flip-flop 22b receives the signal S2 at a D port, latches the data in the D port at the rising edge of the comparator output signal Sco, and outputs the latched data from a Q port as a digital output signal Sd2. When the A/D converter 80 is in a normal operation and the control signal Sct is in a disable state, the flip-flop 22b measures a signal on the time axis as a voltage digital signal, and outputs the signal as the digital output signal Sd2. When the A/D converter 80 is in the other-than-normal operation and the control signal Sct is in an enable state, the flip-flop 22b receives only the signal of a value of "0", and thus does not measure a signal on the time axis.

The flip-flop 22c receives the signal S3 at a D port, latches the data in the D port at the rising edge of the comparator output signal Sco, and outputs the latched data from a Q port as a digital output signal Sd3. When the A/D converter 80 is in a normal operation and the control signal Sct is in a disable state, the flip-flop 22c measures a signal on the time axis as a voltage digital signal, and outputs the signal as the digital output signal Sd3. When the A/D converter 80 is in the other-than-normal operation and the control signal Sct is in an enable state, the flip-flop 22c receives only the signal of a value of "0", and thus does not measure a signal on the time axis.

The flip-flop 22d receives the signal S4 at a D port, latches the data in the D port at the rising edge of the comparator output signal Sco, and outputs the latched data from a Q port as a digital output signal Sd4. When the A/D converter 80 is in a normal operation and the control signal Sct is in a disable state, the flip-flop 22d measures a signal on the time axis as a voltage digital signal, and outputs the signal as the digital output signal Sd4. When the A/D converter 80 is in the other-than-normal operation and the control signal Sct is in an enable state, the flip-flop 22d receives only the signal of a value of "0", and thus does not measure a signal on the time axis.

The encoder 9 receives the digital output signals Sd1 to Sdn outputted from the TDC 8, performs encoding processing on the digital output signals Sd1 to Sdn, and outputs a desired output signal Sout.

As described above, in the semiconductor integrated circuit according to the embodiment, the A/D converter 80 is provided with the signal generating circuit 51, the comparator 7, the TDC 8, and the encoder 9. The TDC 8 is provided with the multiplexer 1, the signal generating circuit 2, the control circuit 3, the sequence of the n delay circuits 21a to 21n, the n two-input NOR circuits 6a to 6n, the n flip-flops 22a to 22n. The control circuit 3 generates a control signal Sct in the disable state in a normal operation in which the clock signal Sclk is supplied, and generates a control signal Sct in the enable state in an other-than-normal operation in which the higher voltage source voltage Vdd is supplied while the clock signal Sclk is not supplied. The multiplexer 1 receives the clock signal Sclk and the low-frequency signal Ssg outputted from the signal generating circuit 2. The multiplexer 1 supplies the clock signal Sclk to the sequence of the delay circuits 21a to 21n upon receipt of the control signal Sct in the disable state, and supplies the low-frequency signal Ssg to the sequence of the delay circuits 21a to 21n upon receipt of the control signal Sct in the enable state.

In this manner, in the other-than-normal operation in which the higher voltage source voltage Vdd is supplied while the clock signal Sclk is not supplied, the P-channel and N-channel insulated gate field effect transistors that constitute the sequence of the delay circuits 21a to 21n operate on and off at a low speed. Accordingly, a certain voltage has not been applied to the gates of the P-channel and N-channel insulated gate field effect transistors for a long period. This makes it possible to prevent the increase in the Vth shift of the P-channel insulated gate field effect transistor due to the NBTI significantly. Furthermore, this also makes it possible to prevent the increase in the Vth shift of the N-channel insulated gate field effect transistor due to the PBTI significantly. Accordingly, the reduction of characteristic margins or operation failure due to the BTI can be significantly suppressed in the TDC that requires high accuracy. This reduces the characteristic degradation, the operation failure, or the like of the A/D converter 80, thereby achieving the highly reliable A/D converter 80.

The invention is not limited the above-mentioned embodiments. Various changes and modifications can be made without departing from the spirit and scope of the invention.

In the first to fourth embodiments, the clock signal Sclk is inputted to the inverter chain, while in the fifth embodiment 5, the clock signal Sclk is inputted to the sequence of the delay circuits including the inverters with the multi-stage configuration. However, the invention is not necessarily limited to the configurations. For example, the invention may be applied to a clock signal line having a buffer sequence that includes inverters with the multi-stage configuration and having the same hierarchical clock tree. Furthermore, the invention may be applied to a clock driver in a DLL circuit which includes inverters with the multi-stage configuration and which receives an oscillation frequency. In addition, in the first to fourth embodiments, the inverter chain is used as transmitting means of the clock signal Sclk. However, a logic gate other than the inverter such as an AND circuit, an OR circuit, a NAND circuit, a NOR circuit, an Ex-OR circuit, or a clocked inverter may be used, alternatively.

What is claimed is:

1. A semiconductor integrated circuit, comprising:
a control circuit to output a control signal in a disable state when an input signal is supplied, and to output a control signal in an enable state when the input signal is not supplied;
a signal generating circuit to generate a low-frequency signal based on the control signal, the low-frequency signal having a frequency lower than the input signal has;
a multiplexer to receive the input signal and the low-frequency signal, to output the input signal upon receipt of the control signal in the disable state, and to output the low-frequency signal upon receipt of the control signal in the enable state;
a first logic gate to receive the signal outputted from the multiplexer, the first logic gate having any one of a single stage configuration and a multi-stage configuration; and
a second logic gate to receive the control signal and a signal outputted from the first logic gate, to output the signal outputted from the first logic gate upon receipt of the control signal in the disable state, and to stop outputting the signal outputted from the first logic gate upon receipt of the control signal in the enable state.

2. The semiconductor integrated circuit according to claim 1, wherein the input signal is any one of a clock signal, a data signal, and an oscillation signal.

3. The semiconductor integrated circuit according to claim 1, wherein
the first logic gate is any one of an inverter, a clocked inverter, an AND circuit, an OR circuit, a NAND circuit, a NOR circuit, and an Ex-OR circuit, and
the second logic gate is a two-input NOR circuit.

4. The semiconductor integrated circuit according to claim 1, wherein the signal outputted from the second logic gate is inputted to a serial input/output shift register as a clock signal.

5. The semiconductor integrated circuit according to claim 1, wherein
the control circuit, the signal generating circuit, the multiplexer, the first logic gate, and the second logic gate are provided in a time to digital converter (TDC),
the first logic gate includes odd-numbered stages of inverters,
the second logic gate includes a two-input NOR circuit, and
the signal outputted from the second logic gate is inputted to a D port of a flip-flop provided in the TDC.

6. The semiconductor integrated circuit according to claim 1, further comprising a power supply circuit to supply the first logic gate with a voltage lower than a higher voltage source voltage when the input signal is not inputted to the first logic gate.

7. A semiconductor integrated circuit, comprising:
a control circuit to output a control signal in a disable state when an input signal is supplied, and to output a control signal in an enable state when the input signal is not supplied;
a counter to alternately generate a count signal having a value of 1 and a count signal having a value of 0 (zero) based on the control signal every time the input signal is updated;
a multiplexer to receive the input signal and the count signal, to output the input signal upon receipt of the control signal in the disable state, and to output the count signal upon receipt of the control signal in the enable state;
a first logic gate to receive the signal outputted from the multiplexer, the first logic gate having any one of a single stage configuration and a multi-stage configuration; and
a second logic gate to receive the control signal and a signal outputted from the first logic gate, to output the signal outputted from the first logic gate upon receipt of the control signal in the disable state, and to stop outputting the signal outputted from the first logic gate upon receipt of the control signal in the enable state.

8. The semiconductor integrated circuit according to claim 7, wherein the input signal is any one of a clock signal, a data signal, and an oscillation signal.

9. The semiconductor integrated circuit according to claim 7, wherein
the first logic gate is any one of an inverter, a clocked inverter, an AND circuit, an OR circuit, a NAND circuit, a NOR circuit, and an Ex-OR circuit, and
the second logic gate is a two-input NOR circuit.

10. A semiconductor integrated circuit, comprising:
a control circuit to output a control signal in a disable state when an input signal is supplied, and to output a control signal in an enable state when the input signal is not supplied;
a first logic gate to receive the input signal, the first logic gate having any one of a single stage configuration and a multi-stage configuration;
a power supply circuit to supply the first logic gate with a higher voltage source voltage upon receipt of the control signal in the disable state, and to stop supplying the first logic gate with the higher voltage source voltage upon receipt of the control signal in the enable state; and
a second logic gate to receive the control signal and a signal outputted from the first logic gate, to output the signal outputted from the first logic gate upon receipt of the control signal in the disable state, and to stop outputting the signal outputted from the first logic gate upon receipt of the control signal in the enable state.

11. The semiconductor integrated circuit according to claim 10, wherein the input signal is any one of a clock signal, a data signal, and an oscillation signal.

12. The semiconductor integrated circuit according to claim 10, wherein
the first logic gate is any one of an inverter, a clocked inverter, an AND circuit, an OR circuit, a NAND circuit, a NOR circuit, and an Ex-OR circuit, and
the second logic gate is a two-input NOR circuit.

* * * * *